United States Patent [19]

Bargett et al.

[11] Patent Number: 4,695,794
[45] Date of Patent: Sep. 22, 1987

[54] VOLTAGE CALIBRATION IN E-BEAM PROBE USING OPTICAL FLOODING

[75] Inventor: Charley B. Bargett, Santa Barbara; Roderic L. Osgood, Goleta; Joseph L. Davis, Santa Barbara; Richard J. Joyce, Thousand Oaks, all of Calif.

[73] Assignee: Santa Barbara Research Center, Goleta, Calif.

[21] Appl. No.: 739,832

[22] Filed: May 31, 1985

[51] Int. Cl.⁴ .............................................. G01R 31/28
[52] U.S. Cl. ............................. 324/158 R; 324/158 D
[58] Field of Search .............. 324/158 R, 158 D, 71.3, 324/74; 250/310, 311

[56] References Cited

U.S. PATENT DOCUMENTS 4,415,851 11/1983 Langner et al. ................. 324/158 R Primary Examiner—Ernest F. Karlsen
Attorney, Agent, or Firm—Ronald L. Taylor; A. W. Karambelas

[57] ABSTRACT

Method and apparatus for calibrating equipment used for testing photodiode arrays by reference to the diode under test. The diodes are illuminated with infrared radiation and different bias voltages, developed by bombardment with an electron beam, are measured at zero current. The measured voltage values are correlated with secondary emission sensor readouts to calibrate the sensor according to the specific diode being tested. Remote light emitting diodes generate the infrared radiation which is coupled to the photodiode array via optical fiber elements.

23 Claims, 5 Drawing Figures

VOLTAGE CALIBRATION IN E-BEAM PROBE USING OPTICAL FLOODING

BACKGROUND OF THE INVENTION

The development of photodiode arrays comprising large numbers of individual elements is becoming increasingly important in certain specific applications. For quality assurance, it is virtually essential that screening of a fabricated photodiode array on an individual element basis be performed prior to incorporation of the array in utilization equipment. Heretofore, such screening has been performed by mechanical probing of the elements, usually on a single element basis. The results of such a procedure are less than satisfactory. Delicate indium bumps which are provided for circuit test contacts are easily damaged by a contacting probe. The procedure is a very time-consuming operation. A further disadvantage is that the results of the procedure are extremely operator dependent.

Given the nature of the problem—small detector size (approximating 1.5×1.5 mils) of typical multi-element hybrid focal plane arrays and the delicate character of the indium interconnects—some type of non-contacting method of diode probing is desired, preferably one which can be automated or at least performed in a way which provides results which are independent of operator parameters.

A system has been developed which uses an electron beam integrated circuit tester for testing the internal nodes of a complex integrated circuit. This system incorporates electron beam apparatus which focuses and directs the electron beam to selected internal nodes and detects secondary electron emission therefrom with associated computerized control circuitry. As thus controlled, the electron beam apparatus provides high speed access and testing of the integrated circuit nodes.

In one version of the system, the probe intelligently chooses a limited number of the internal nodes which are considered most likely to indicate circuit failure so as to minimize the number of nodes tested while maximizing reliability of the results. The probe comprises an artificial intelligence which understands the design and operation of the integrated circuit under test, the intelligence being embodied in a programmed computer associated with the probe. The system further includes circuitry for accessing the peripheral pads of the integrated circuit under test and for applying the proper circuit biases, clock signals and test signals under control of the computer. In such a system, the movement of the electron beam between selected internal nodes of the circuit and the operation of the associated computer to select those nodes are decisions which may be made in a matter of microseconds or milliseconds.

The electron beam of the test apparatus, when focused on a single selected node within the circuit, creates secondary electron emission having a flux which is affected by the properties of the node on which the electrons of the primary beam impinge. A suitable detector responds to the secondary emission electron flux, permitting the computer to sense and store the voltage of the node under test.

A particular advantage of such a system is that the probe does not capacitively load any of the internal nodes of the integrated circuit under test, nor does it damage them. At the same time, the electron beam of the probe has a submicrometer diameter and is easy to position with great precision. Because of the high speed with which the nodes may be selected and tested, use of the system on a production line having high product through-put is cost effective and is inherently more reliable than the conventional testing methods outlined hereinabove.

E-beam testing of individual photodiodes in a photodiode array has also been accomplished. Instead of directing the electron beam to internal circuit nodes, as described above, the beam is used to access the free electrode of a selected diode in the array. These arrays comprise individual photodiodes, one electrode of which is connected to a common ground or reference plane. The other electrodes are individually coupled to corresponding indium antimonide bumps which complete the circuit to the associated photodiodes when the diode array is mounted in utilizing apparatus. These other electrodes are also wire bonded in selected groups to an external pin connection.

In testing the photodiode array, the E-beam is used to direct the electrons to the selected diode, developing a predetermined voltage thereon. The corresponding current of the diode is measured by an electrometer coupled in the circuit path to the common diode substrate reference plane. Various diode voltage levels are established by controllably varying the duty cycle of the pulsed E-beam and are measured by an associated voltage contrast sensor comprising a scintillator which responds to secondary emission electron flux from the particular diode under test. The particular I-V measurements developed in the manner described are compared with corresponding I-V plots of similar diodes of known quality characteristics, utilized as a reference, to determine if the diode under test is acceptable or not.

The reliability of the I-V measurements developed in this manner depends upon an assumption that the quality characteristics of the diode under test do not differ materially from those of the diode used as a reference. This is intended to be a reasonable assumption, since the diode used as a reference will be one which is located on the same wafer as the diode array under test, thus presumably having been fabricated under the same conditions. It does not always work out that way, however. Sometimes, for reasons which are not fully understood, there may be substantial variations in the operating parameters and characteristics of different diodes on the same wafer.

Additionally, the I-V measurements depend upon an indirect calibration of the voltage contrast sensor. The voltage levels measured by the voltage contrast sensor require resort to a look-up table, derived from an indirect calibration of the voltage contrast sensor, to determine the voltage levels of the I-V measurements taken for the diode undergoing test.

It would be preferable to calibrate the voltage contrast sensor from the actual diode under test. However, the typical low background curve for the test diode does not admit of precise determinations of the true values for different voltage levels. It would be desirable to be able to calibrate the voltage contrast sensor for an individual diode by measuring the zero-current crossings of the voltage axis with increased precision, sufficient to make the calibration reliable.

SUMMARY OF THE INVENTION

In brief, arrangements in accordance with the present invention utilize a scanning electron microscope for calibration prior to E-beam testing of individual photodiodes in a diode array while the array is illuminated with infrared radiation at a high background level. More positive determination of the response curve of the photodiode is achieved by this method and the voltage contrast sensor output for the photodiode under test can be directly calibrated to actual diode measurements. It therefore becomes unnecessary to resort to the intermediate calibration step of comparison with a reference diode characteristics.

In accordance with the present invention, illumination of the photodiode array for calibration during testing is accomplished by the inclusion in the test apparatus of a plurality of light emitting diodes (LEDs) to provide radiation inthe infrared spectrum. Associated with each of the LEDs is an optical fiber coupling element which directs the radiation from the LED to the immediate area of the photodiode array under test.

In one particular arrangement in accordance with the invention, four LEDs and a corresponding number of optical fiber elements, each coupled to a corresponding LED by a conventional optical coupler, are installed in equally spaced positions, 90° apart, about the periphery of the E-beam test apparatus. The optical fiber elements are led in toward the central portion of the test apparatus by radial bore holes in the mounting fixture and the inner ends of the elements are directed generally axially by angled passages in a mounting disk which is affixed in position adjacent the photodiode array. This structural arrangement simplifies the problem of directing the infrared radiation from the LEDs to the test area of the photodiode array and also makes it possible to replace the LEDs readily when necessary.

The calibration readings for the voltage contrast sensor are derived by actually measuring the open circuit voltages induced on the diode during E-beam scanning prior to taking the measurements for determining the I-V characteristics of the diode and while the diode is illuminated with high background radiation from the LEDs. An electrometer is connected across the direct circuit connections to the photodiode electrodes. The voltage induced on the diode by E-beam illumination is then ramped over the calibration range during open circuit (zero diode current) conditions, and measurements of output voltage from the voltage contrast sensor are correlated with the true diode voltages as determined by the electrometer. Thus a calibration of the voltage contrast sensor output for that particular diode is developed. Subsequently, the LEDs are turned off and testing of the diode to develop the I-V characteristics in the manner described above is conducted, with the calibration curve for the voltage contrast sensor as derived from the operation of the diode in the calibration mode in accordance with the present invention being used as a reference for the voltage measurements by the voltage contrast sensor.

BRIEF DESCRIPTION OF THE DRAWING

A better understanding of the present invention may be had from a consideration of the following detailed description, taken in conjunction with the accompanying drawing in which.

DESCRIPTION OF THE PREFERRED EMBODIMENT

Figure 1:
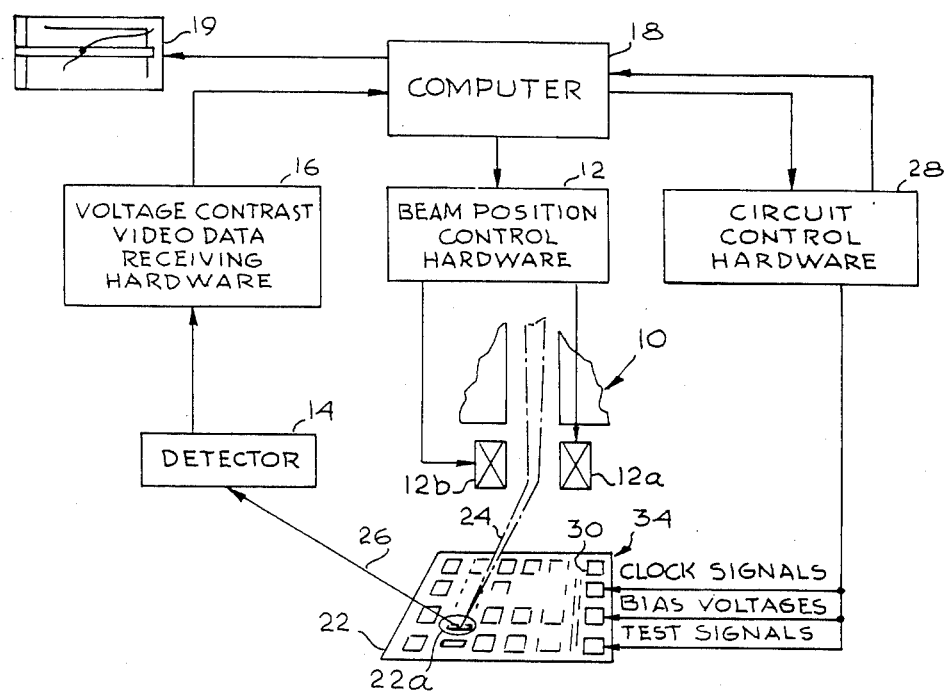
FIG. 1 is a schematic block diagram of particular apparatus which is representative of arrangements in accordance with the present invention.

The schematic block diagram of FIG. 1 represents an overall system incorporating the present invention for E-beam calibrating and testing of photodiode arrays. In FIG. 1, an electron beam generator 10 is shown in association with beam position control hardware 12 which includes deflection coils 12a and 12b, together with a secondary emission electron detector 14 and associated voltage contrast video data receiving hardware 16. A computer 18 is coupled to control the beam position hardware 12 and the voltage contrast hardware 16. A plotter 19 is coupled to the computer 18 as an output device. The correlated data is processed by the computer 18 which controls the plotter 19 to produce an I-V curve for the photodiode under test.

An electron beam 24 from the beam generator 10 is directed toward the array 22, instantaneously to a single photodiode 22a thereof, to create secondary electron emission 26 which is received at the detector 14. The array 22 is activated by means of circuit control hardware 28, also controlled by the computer 18. The circuit control hardware 28 generates clock signals, test signals and bias voltages which are applied to appropriate paths 30 along the periphery of the array 22 to complete the test circuit paths and also measures individual diode current for inputting the computer 18 where it is correlated with corresponding diode voltage data from the voltage contrast hardware 16.

In utilizing the apparatus of FIG. 1 for taking I-V measurement data of a particular photodiode, the computer 18 selects a particular diode 22a to be tested and directs the circuit bias input signal hardware 28 to apply appropriate clock signals, bias voltages and test signals to the appropriate ones of the paths 30; it also causes the beam position control hardware to direct the electron beam 24 to focus on the particular selected diode 22a. Secondary emission electrons 26 are directed to the detector 14 and sensed thereby to generate an output voltage proportional to the flux of electrons in the secondary electron emission 26. The electron flux and the resulting output voltage generated by the detector 14 are proportional to the potential of the selected diode 22a. The receiving hardware 16 converts the voltage signal from the detector 14 to a number corresponding to the actual voltage of the photodiode 22a and supplies this data to the computer 18. At the same time, the circuit control hardware 28 measures the current to the diode 22a under test and also supplies this data to the computer 18.

As is well known to those skilled in the art, if the impacted surface of the diode 22a is raised to a positive potential (for example +5 volts), the amount of secondary electron emission reaching the detector 14 will be reduced proportionally. On the other hand, if the photodiode 22a develops a lesser positive or a negative potential, the secondary emission electron flux will be greater in proportion to the change in potential. Thus the secondary emission electron flux increases with a decrease in positive potential or increase in negative potential on the selected diode 22a.

Figure 2:
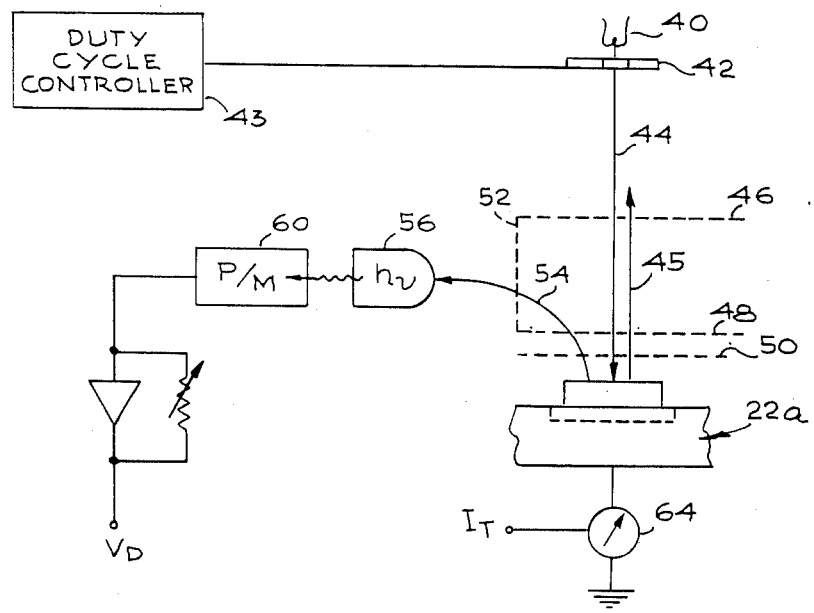
FIG. 2 is a schematic diagram illustrating the use of the apparatus of FIG. 1 in taking I-V measurements of a particular photodiode.

FIG. 2 illustrates further details of the procedure used in testing a single photodiode 22a. In FIG. 2, an electron source 40 is shown associated with a chopper 42 and duty cycle controller 43 for modulating the incident electron beam, represented by the arrow 44, by selectively varying the pulsed beam duty cycle. Broken lines 46, 48 and 50 represent a trap grid, an analyzer grid and an extraction grid, respectively. A collection grid 52 directs the secondary emission electrons, represented by the curved arrow 54, to a scintillator 56. Photons from the scintillator 56 trigger a photomultiplier 60 and the resultant electrical signal is amplified by a preamplifier 62 to develop the voltage contrast sensor output. Concurrently, a diode sample current $I_T$ is measured by a measuring device 64 in the circuit control hardware 28 (FIG. 1). The arrangement of FIG. 2 illustrates the means by which the secondary electrons are selected by the voltage contrast sensor. The extraction grid 50 overwhelms the localized field of the target and pulls off the secondary electrons while the analyzer grid 48 either optimizes or analyzes the secondary electron yield. The trap grid 46 and collection grid 52 direct the secondary electrons into the scintillator 56 without affecting the primary beam, while allowing the backscattered electrons (indicated by the arrow 45) to travel back up to the E-beam column area and be absorbed.

In the test procedure, the E-beam acts as a current source to each diode under test. The E-beam is pulsed by the chopper 42 and the pulse length in each duty cycle is varied by the duty cycle controller 43 to control the voltage imposed on the diode under test. Diode bias voltages are sensed by measuring the secondary electron emission energy and converting this energy to a voltage. Sample diode currents are externally measured to complete the I-V data.

The sample diode current $I_T$, measured at 64, is equal to the difference between the primary electron beam current $I_p(44)$ and the secondary electron current $I_S(54)$ less the backscatter electron current $I_B(45)$. The equivalent electrical circuit for a photodiode includes parallel resistive and capacitive paths. Thus the average current and voltage for a test diode are controlled by varying the duty cycle of successive primary E-beam pulses, preferably between about 10% and about 90%. The E-beam scans a number of photodiodes in succession and repetitively, thus building up the bias voltages of the diodes with each scan as the bias voltage and sample current measurements are taken. In this manner the E-beam tester functions as a variable voltage source by varying the bias voltages while diode current is measured, thereby providing the individual data points of sampled current and voltage to develop the I-V characteristic curve of each individual diode, as plotted by the plotter 19.

In conjunction with the test procedure described above in connection with the operation of the apparatus of FIG. 1, a calibrating procedure is conducted for the purpose of calibrating the voltage output of the detector 14 for the individual diode to be tested. This calibration procedure is preferably conducted prior to the taking of the I-V measurements and invloves the flooding of the region of the diode with high background level radiation. Particular structure to accomplish this is represented in the schematic drawings of FIGS. 3 and 4.

Figure 3:
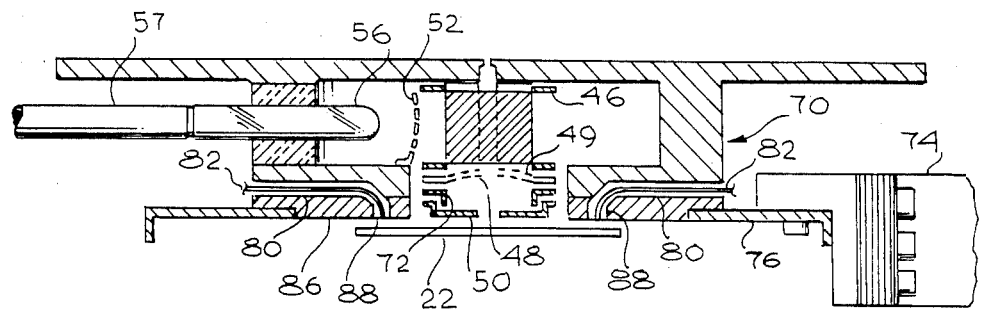
FIG. 3 is a sectional view of particular structure of the present invention as utilized in the apparatus of FIG. 1.

Many of the elements shown in the schematic diagram of FIG. 2 are represented in the sectional drawing of FIG. 3 and are designated by the same reference numerals. Thus, the structure of FIG. 3 is shown as comprising, within a housing 70, a trap grid 46, an analyzer grid 48 and an extraction grid 50 formed generally as annular disk elements through which the E-beam is directed toward the wafer 22. The scintillator 56 in FIG. 3 is shown as a single unit adjacent a deflection or collection grid 52. At the outboard end of the scintillator 56 is a light pipe 57 which leads to a photomultiplier 60 (FIG. 2). Additional elements mounted within the housing 70 include a compensator electrode 72 and a screen or secondary analyzer grid 49. A cooling strap 74 is connected to the housing 70 by an annular infrared shield 76. The structure of FIG. 3, including the wafer 22, is typically maintained at approximately 40° Kelvin during testing. The various electrical circuit connections for maintaining the potentials of the elements shown in FIG. 3 have been omitted for simplicity.

The housing 70 is provided with a plurality of radially directed tubes 80 which are curved downwardly toward the wafer 22 at the radially inward ends thereof. Within these tubes or bore holes 80 are mounted optical fiber elements 82 which extend from the lower face of the housing 70, adjacent the wafer 22, outwardly to corresponding light emitting diodes 84, such as the LED shown schematically in FIG. 4. Each optical fiber 82 is releasably held in position to receive radiation from its associated LED 84 by means of a coupling sleeve member 86. The LEDs 84 are coupled to a power supply 89.

In the preferred embodiment, four optical fiber elements 82 are mounted within the housing 70, spaced at 90° angular positions. A suitable LED for use in the preferred embodiment of the invention is the Honeywell SE 3362 LED. This unit emits a narrow band of radiation centered at approximately 0.82 microns, which has been found to be suitable for the spectral response of the InSb diodes which are involved here. This LED meets the optical power requirements for use in the present invention, and three or four LEDs, mounted as indicated, are enough to assure the desired level of illumination. The coupler 87 is a conventional device which permits removal of the LED 84 for replacement or removal to permit adjustment of the structure shown in FIG. 3. Use of the coupler and the optical fiber elements facilitates the installation of the LEDs, since the LEDs can be mounted outside the cold stage housing 70 where they can be readily replaced and where any heat dissipated in the LEDs does not reach the cold stage.

The mounting of the LEDs outside the cold box housing is important in order to be able to avoid having to disassemble the entire structure when it becomes necessary to replace an LED. Assembling the grid arrangement depicted in FIG. 3 is a rather expensive and difficult operation, since the various grids and other elements having to do with control of the E-beam must be precisely located and then "burned in" in order to develop the required field linearity for suitable control of the E-beam diode test system. If the assembly had to be taken apart, as for replacement of an LED installed in a position to illuminate the diode array directly, it would be necessary to replace the entire beam control section. Such a requirement is totally avoided by the arrangement of the present invention wherein the LEDs are mounted outside the beam control housing.

In the preferred embodiment of the optical fiber element mounting structure of FIG. 3, the lower part of the housing 70 comprises a disk 86 having angled openings 88 for directing the inner ends of the elements 82 downwardly toward the wafer 22. The disk 86 fits against the lower face of the adjacent portion of the housing 70 in which the radial passages 80 for the optical fiber elements 82 are formed as radially directed slots. Thus the fabrication of the optical fiber element tubes is simplified, as are assembly and disassembly of the elements making up this portion of the structure.

The arrangement of FIG. 3 shows only a single scintillator 56. Favorable results have been achieved in a similar structure mounting two scintillators, like the one shown, at 180° apart from each other. An alternative arrangement utilizes a scintillator in the form of a ring surrounding the beam axis.

Figure 4:
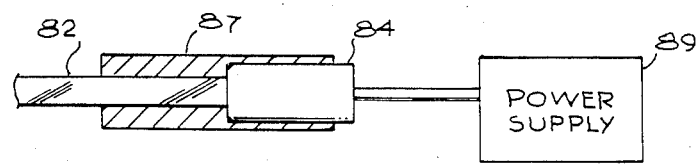
FIG. 4 is a schematic block diagram illustrating a portion of the arrangement of FIG. 3.
Figure 5:
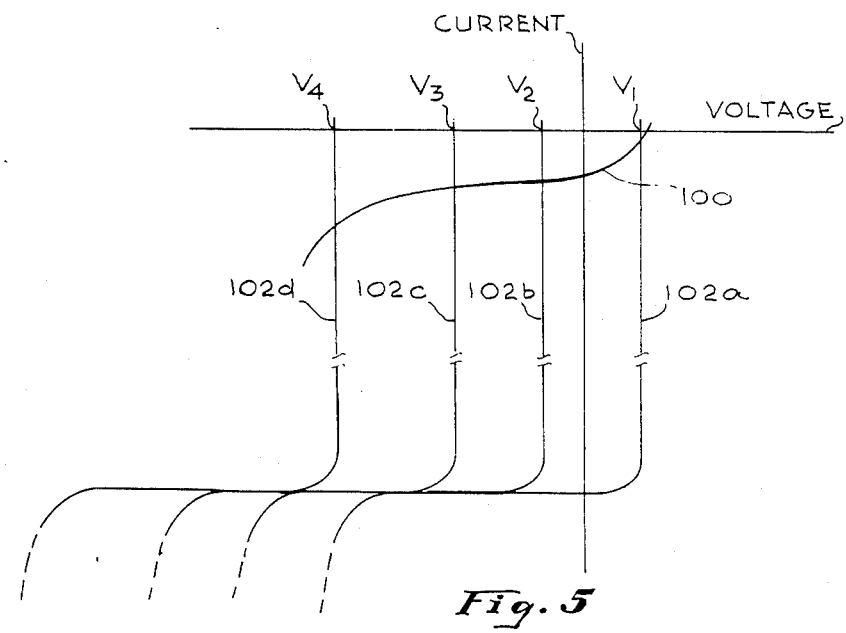
FIG. 5 is a graph illustrating the calibration of particular voltage measuring equipment using the present invention.

In the calibration of the voltage contrast detector 14 in the apparatus of FIG. 1, prior to testing, the diode under test is illuminated with high background radiation by energizing the LEDs 84 from the power supply 89 (FIG. 4). The circuit control hardware 28 opens the circuit to the common electrode of the diode in the array 22 and the E-beam from the scanning electron microscope is controlled to ramp the voltage to selected voltage levels within the range of calibration. FIG. 5 is a graph showing the difference between the diode characteristic curves for low background and high background levels. The curve 100 is a typical I-V curve without background illumination. Attempting to calibrate the voltage contrast sensor from such a curve would require the taking of both current and voltage measurements, and the results would lack the necessary precision for proper calibration. By contrast, the curves 102 represent a family of I-V characteristic curves of a diode illuminated with infrared radiation from the LEDs of FIG. 4, each having a very definite and precise zero crossing level. To accomplish the calibration procedure, circuit control hardware 28 (Fig. 1) opens the circuit path to the diode under test and measures the voltage of the electrode impinged by the E-beam as this voltage is varied by suitable control of the E-beam. In FIG. 5, four different voltages $V_1$–$V_4$ are shown as measured at zero current levels to establish the calibration curve by which the voltage contrast sensor output is uniquely referenced to the diode under test. A separate calibration for each separate diode being tested is thus developed in conjunction with the test procedure. As indicated in FIG. 5, the calibration voltage is ramped from a low level of one polarity ($V_1$) over a range of voltages ($V_2$–$V_4$) of the other polarity. These voltage levels are typically in the millivolt range and, depending upon the particular diode involved, may range from approximately +100 mv ($V_1$) to several hundred millivolts negative ($V_4$). After each diode is calibrated, the LEDs are turned off and the measurements to develop the I-V curve data are taken with a low background, using the calibrated output of the voltage contrast sensor for the bias voltage readings.

In the I-V testing procedure, registration marks are used to precisely locate the E-beam apparatus relative to a target. These marks are strategically positioned on the photodiode array and are utilized in positioning the array relative to the E-beam apparatus prior to initiating the test procedures. These marks are preferably made of some heavy (high atomic number) metal deposited on a dielectric material, such as nickel against $SiO_2$, in the form of a cross of approximately ten microns width and 100 microns arm length, within a scan field of approximately $2 \times 2$ mm. The nickel against silicon dioxide registration mark provides an excellent contrast and is readily discernible.

The system of the present invention utilizes commercially available equipment for its operation. The electron beam generator 10 including the electron source 40, the chopper 42, beam position control hardware 12 with focusing and deflection coils 12a, 12b, the vacuum system in which the testing is performed, and the associated controls for this equipment are all embodied in a Cambridge S150 scanning electron microscope which is commercially available and is well known among workers skilled in this art. A slight redesign is employed to adapt the unit to cryogenic operation. The computer 18 is a Digital Equipment Corporation PDP11/34 Minicomputer.

The secondary emission electron detector 14 is preferably a detector probe developed by Siemens A.G. of West Germany. This detector has been described in *Scanning Electron Microscopy* by Peuerbach, Vol. 1, 1979, pp. 285-318, FIG. 5, p. 290 and by Fazekas et al, "Scanning Electron Beam Probes VLSI Chips", *Electronics*, July 14, 1981, pp. 105-112 at p. 109, FIG. 5.

There has thus been shown and described hereinabove one particular arrangement in accordance with the invention for calibrating the voltage contrast sensor output for each individual diode while testing photodiode arrays without directly contacting the photodiodes, utilizing an E-beam probe. By varying the duty cycle of the chopped E-beam and measuring the different bias voltages at zero diode current while flooding the diode under test with a high background level of infrared radiation, a succession of calibration voltage levels is derived which is used to relate the voltage contrast sensor output for that diode with actual voltage measurements. This calibrated output is then referenced directly in measuring diode voltage while taking corresponding current measurements for the I-V curve data needed as the diode test result. Proceeding in this manner, an entire array of photodiodes may be tested within a relatively short time interval, thus providing a procedure which is appropriate for production line use. The E-beam calibration and testing procedure serves to standardize the testing parameters, thereby eliminating variations previously introduced by individual operators, and lends itself readily to automation with the attendant improvement in through-put capability and reliability of result.

Although there has been described above one specific arrangement of improved apparatus for voltage calibration in E-beam probe using optical flooding in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. Photodiode testing apparatus comprising:
   electron-beam source means for generating a beam of primary electrons;
   beam control means for directing the beam to a selected diode in a photodiode array;
   means for modulating the electron beam to develop predetermined bias voltages at the selected diode;
   voltage sensing means responsive to secondary emission electrons from the selected diode for providing output signals which are proportional to the diode bias voltages;

means for directly measuring the induced bias voltages at zero diode current;

means for correlating the measured bias voltages with corresponding output signals from the voltage sensing means; and means for illuminating the selected diode on the same side of the diode as the electron-beam source means with a high background level of infrared radiation in order to sharpen the zero crossings of the I–V characteristic curves of the diode during the measurement of the bias voltages at zero diode current.

2. The apparatus of claim 1 further including means for calibrating the output signals of the voltage sensing means to each individual diode of the array in succession as the diode undergoes testing for I–V curve data.

3. The apparatus of claim 2 wherein the means for illuminating the selected diode includes a source of infrared radiation.

4. The apparatus of claim 3 wherein said source is remotely mounted from the position of the selected diode.

5. The apparatus of claim 4 further including infrared radiation coupling means extending between the remotely mounted radiation source and a region in the near vicinity of the selected diode.

6. The apparatus of claim 5 further including means for orienting the terminating end of the coupling means in the near vicinity of the selected diode to direct said infrared radiation toward said diode.

7. The apparatus of claim 5 wherein said source comprises a light emitting diode capable of emitting radiation in the infrared region and said coupling means comprise an optical fiber element coupled to receive radiation from said diode and transmit it to the vicinity of the selected diode.

8. The apparatus of claim 4 wherein the infrared radiation source comprises a plurality of light emitting diodes located in generally equally spaced positions about the electron beam control means, said positions being separate from the electron beam control means and remote from the position of the selected diode, and further including means for individually coupling radiation from the light emitting diodes to the vicinity of the selected diode.

9. The apparatus of claim 8 wherein said radiation coupling means comprise a plurality of optical fiber elements individually coupled to corresponding light emitting diodes.

10. The apparatus of claim 9 wherein said coupling means further comprises an optical coupler for releasably retaining a light emitting diode in coupling relationship with an associated optical fiber element.

11. The apparatus of claim 9 wherein the beam control means comprise a housing, a plurality of electrodes for controlling the primary electron beam and the secondary emission electrons, and means for mounting said electrodes within said housing.

12. The apparatus of claim 11 wherein said housing includes a plurality of generally radially directed bore holes, each being disposed to receive a corresponding optical fiber element therein, and means for directing the terminating ends of the respective optical fiber elements toward the selected diode.

13. The apparatus of claim 12 wherein the portion of said housing adjacent the photodiode array comprises a disk which is separable from said housing, the portion of the housing facing said disk defining a plurality of slots forming parts of said bore holes, and wherein said disk includes a plurality of angled openings for directing the optical fiber elements from a generally radial orientation within said slots to an orientation having the terminating end of the optical fiber element facing said array.

14. The apparatus of claim 1 wherein the infrared radiation source comprises four light emitting diodes spaced approximately 90° apart about the beam control means and further including an optical fiber element and an optical coupler for each of the light emitting diodes, the optical coupler being disposed to couple the light emitting diode to its corresponding optical fiber element for transmitting infrared radiation into the fiber element, and means for directing each of the optical fiber elements to terminate in a position adjacent the selected diode for directing the infrared radiation thereto.

15. The apparatus of claim 14 further including power supply means coupled to the light emitting diodes for controlling the intensity of radiation generated therein.

16. The method of calibrating the output of voltage measuring apparatus which is responsive to secondary emission electrons from a selected diode of an array undergoing testing in electron beam scanning apparatus comprising the steps of:

bombarding a selected diode with a primary electron beam to develop successive bias voltages on said diode;

measuring said bias voltages directly while maintaining the selected diode in a zero current mode;

developing voltage measurements from said secondary emission electron stream which are proportional to said bias voltages;

temporarily illuminating the selected diode on the same side of the diode as the bombardment with the primary electron beam with a substantial level of background radiation from a light emitting diode source to develop distinctly detectable zero current crossings of the current/voltage operating characteristics of said diode at said successive bias voltages; and correlating the values of voltage measurements sensed from the secondary emission electron stream with said directly measured bias voltage values in order to calibrate the sensed values with the specific characteristics of said selected diode.

17. The method of claim 16 wherein the step of illuminating the selected diode comprises directing infrared radiation over a predetermined path from a remote light emitting diode source to a region adjacent the selected diode.

18. The method of claim 17 wherein said illuminating step further comprises coupling an optical fiber element to said light emitting diode source and directing said optical fiber element over a predetermined path to a termination adjacent the selected diode.

19. The method of claim 18 further including the step of directing the terminating end of the optical fiber element to transmit radiation in the direction of the selected diode.

20. The method of claim 19 wherein the light emitting diode source comprises a plurality of light emitting diodes connected to a power supply and being positioned in locations remote from the selected diode and generally equally spaced about the primary electron beam, and further including the step of providing a plurality of optical fiber elements individually associated with corresponding ones of said light emitting diodes to transmit said radiation from the light emitting diodes to the region of the selected diode.

21. The method of claim 16 wherein said selected diode is illuminated concurrently with the measuring of said bias voltages and thereafter the illumination is removed for the testing of said selected diode to develop I-V curve data for the diode.

22. The method of claim 21 wherein the steps of said method are performed repetitively for each different diode in said array.

23. Photodiode testing apparatus comprising:
electron-beam source means for generating a beam of primary electrons;
beam control means for directing the beam to a selected diode in a photodiode array;
means for modulating the electron beam to develop predetermined bias voltages at the selected diode;
voltage sensing means responsive to secondary emission electrons from the selected diode for providing output signals which are proportional to the diode bias voltages;
means electrically connected to a side of the diodes in the array remote from the electron-beam source for directly measuring the induced bias voltages at zero diode current;
means for correlating the measured bias voltages with corresponding output signals from the voltage sensing means; and
means for temporarily illuminating the selected diode with a high background level of infrared radiation prior to measuring the induced bias voltages in order to sharpen the zero crossings of the I-V characteristic curves of the diode during the measurement of the bias voltages at zero diode current.

* * * * *